United States Patent
Kasztenny et al.

(10) Patent No.: US 10,938,198 B2
(45) Date of Patent: Mar. 2, 2021

(54) VARIABLE WINDOW LENGTH FILTER FOR PROTECTIVE RELAYING

(71) Applicant: Schweitzer Engineering Laboratories, Inc., Pullman, WA (US)

(72) Inventors: Bogdan Z. Kasztenny, Markham (CA); Chadburn Troy Daniels, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 84 days.

(21) Appl. No.: 16/423,832

(22) Filed: May 28, 2019

(65) Prior Publication Data

US 2020/0112161 A1 Apr. 9, 2020

Related U.S. Application Data

(60) Provisional application No. 62/740,504, filed on Oct. 3, 2018.

(51) Int. Cl.
| | |
|---|---|
| *H02H 1/00* | (2006.01) |
| *H04B 3/54* | (2006.01) |
| *H02H 3/00* | (2006.01) |
| *G01R 31/42* | (2006.01) |
| *G01R 31/50* | (2020.01) |

(52) U.S. Cl.
CPC ........... *H02H 1/0092* (2013.01); *G01R 31/42* (2013.01); *G01R 31/50* (2020.01); *H02H 1/0007* (2013.01); *H02H 3/00* (2013.01); *H04B 3/54* (2013.01)

(58) Field of Classification Search
CPC ...... H02H 1/0092; H02H 1/0007; H02H 3/00; H02H 3/40; H04B 3/54; G01R 31/11; G01R 31/42; G01R 31/50
See application file for complete search history.

(56) References Cited

U.S. PATENT DOCUMENTS

| | | | |
|---|---|---|---|
| 5,208,545 A | 5/1993 | Schweitzer | |
| 5,809,045 A | 9/1998 | Adamiak | |
| 6,311,307 B1 | 10/2001 | Adamiak | |
| 6,417,791 B1* | 7/2002 | Benmouyal | .......... H02H 1/0092 341/111 |
| 6,456,947 B1 | 9/2002 | Adamiak | |
| 7,345,862 B2 | 3/2008 | Schweitzer | |
| 7,532,955 B2 | 5/2009 | Dougherty | |
| 9,976,507 B2 | 5/2018 | Ferguson | |
| 10,114,052 B2 | 10/2018 | Kasztenny | |
| 2002/0149893 A1* | 10/2002 | Kurosawa | ................ H02H 3/40 361/76 |
| 2017/0102426 A1* | 4/2017 | Schweitzer, III | ...... G01R 31/11 |
| 2017/0248635 A1 | 8/2017 | Mattoon | |

(Continued)

*Primary Examiner* — Kyle J Moody
*Assistant Examiner* — Jye-June Lee
(74) *Attorney, Agent, or Firm* — Richard M. Edge (57) ABSTRACT

Variable window filtered power system signals for electric power system monitoring and protection operations of an electric power system are provided herein. Upon detection of a power system disturbance, the filter window is decreased after a predetermined resize delay such that pre-disturbance samples are not included in the new window. As additional samples are obtained, the filter window grows to include new samples until the window reaches an initial filter window length. Gain and group delay correction factors accounting for window size and signal frequency are approximated.

20 Claims, 6 Drawing Sheets

(56) References Cited

U.S. PATENT DOCUMENTS

2019/0094291 A1\* 3/2019 Schweitzer, III .... H02H 1/0092
2019/0094292 A1   3/2019 Schweitzer
2019/0245337 A1\* 8/2019 Oda ..................... H02H 1/0092

\* cited by examiner

VARIABLE WINDOW LENGTH FILTER FOR PROTECTIVE RELAYING

RELATED APPLICATION

This application claims benefit under 35 U.S.C. § 119(e) to US provisional application Ser. No. 62/740,504 filed on 3 Oct. 2018 titled "Band-Pass Finite Impulse Response Filter for Protective Relaying" naming Bogdan Z. Kasztenny and Chadburn Troy Daniels as inventors, which is incorporated herein by reference in its entirety.

TECHNICAL FIELD

This disclosure relates to filtering electric power system signals to produce measurements useful for protection of the electric power delivery system. More particularly, this disclosure relates to filter window re-sizing in response to a disturbance on the electric power system for improving both speed and accuracy of the filtered signal after the disturbance for use by monitoring and protection elements.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

This disclosure relates to the processing of electric power system signals for use in monitoring and protecting the electric power system. Monitoring and protection elements use signals from the electric power delivery system to perform the desired operations. The signals may be alternating current (ac) signals (voltages and/or currents) and other signals such as temperatures or position or the like. The ac signals may be obtained using instrument transformers, which provide analog secondary signals related to voltage and/or current on the electric power delivery system. The secondary signals may be sampled and digitized, and filtered to provide measurements useful for the protective elements. Short circuits and other such abnormal conditions are to be detected by a protective relay, which operates to protect the power system as quickly as possible.

A protective relay detects short circuits by using one or more of the many known relationships between the currents or currents and voltages associated with the protected apparatus, and measured by the relay. These many relationships can be referred to as relay operating principles, or protection principles, and may include the distance protection principle, the differential protection principle, the overcurrent protection principle, and several others depending on the type of apparatus protected.

The need and expectation of speed in power system protection creates challenges. When a short circuit or switching event occurs in the electric power system, transients are generated and present in the voltage and current signals measured by the protective relay. These transients result from the physics of the power system and may include exponentially decaying direct current components in currents, exponentially decaying oscillatory components in currents and voltage with a frequency spectrum on the order of kHz, transients resulting from finite accuracy and construction of instrument transformers such as from saturation of current transformers, or transients in a capacitively coupled voltage transformer (CCVT), and the like.

Transients superimposed on the steady state fault voltages and currents can impair, to a certain degree, the protection principles of the relay. Because of the transients, a relay may delay tripping for an internal fault (an in-zone fault), may fail to trip for an internal fault, or it may trip for an out-of-zone event, or during switching events.

Protective relays apply filtering and intentional delays in various forms to mitigate the impact of transients. However, filtering introduces delay, slowing down the operation of the relay.

Accordingly, what is needed is a protective relay with improved signal processing in the event of transients while maintaining speed. Provided herein are improvements to electric power system signal filtering that mitigate against the impact of transients while maximizing speed for protective relaying.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Several aspects of the embodiments described may be implemented as software modules or components or elements. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions. Software modules or components may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment.

Figure 1:
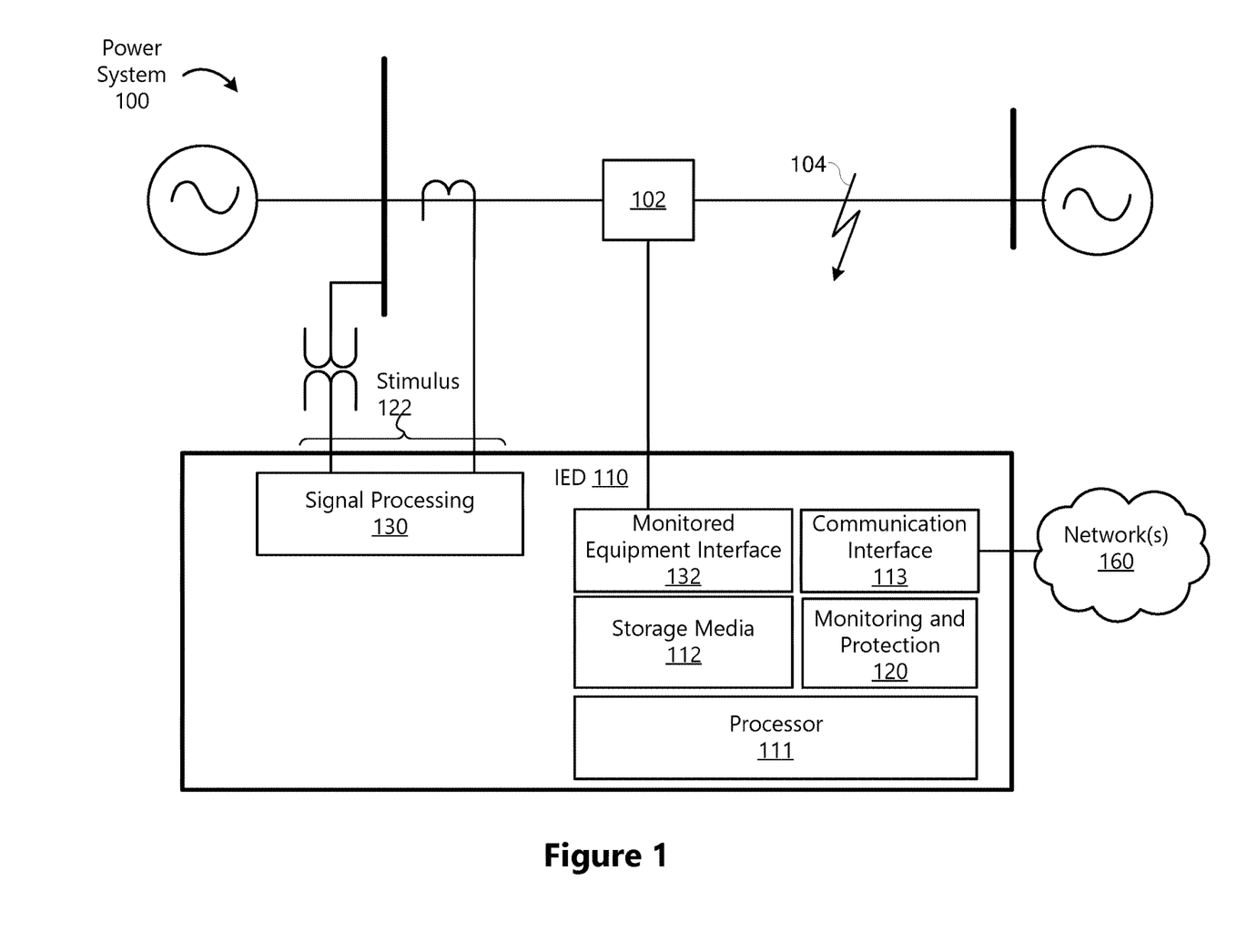
FIG. 1 illustrates a one-line diagram of an electrical power delivery system comprising an Intelligent Electronic Device (IED) implementing signal processing and power system protection in accordance with the embodiments herein.

FIG. 1 illustrates a one-line diagram of an electric power delivery system 100 monitored by an IED 110 that provides electric power system monitoring and protection. The IED may provide protective actions, such as opening a circuit breaker 102 upon detection of a fault 104 (using overcurrent, distance, and/or directional protection elements). IED 110 may comprise and/or be implemented in conjunction with a computing device. IED 110 may include a processor 111, which may comprise one or more general purpose processors, special purposes processors, ASICs, programmable logic elements (e.g., FPGAs), or the like. The IED 110 may further comprise non-transitory machine-readable storage media 112, which may include one or more disks, solid-state storage (e.g., Flash memory), optical media, or the like. The IED 110 may be communicatively coupled to one or more networks 160 via one or more communication interfaces 113. The networks 160 may include special-purpose networks for monitoring and/or controlling the electrical power system 100 (e.g., SCADA networks, or the like). The networks 160 may further include general purpose communication networks, such as a TCP/IP network, or the like. The communication interface 113 may include wired and/or wireless communication interfaces (e.g., serial ports, RJ-45, IEEE 802.11 wireless network transceivers, etc.). In some embodiments, the IED 110 may include human-machine interface (HMI) components (not shown), such as a display, input devices, and so on.

The IED 110 may include monitoring and/or protection functions in a monitoring and protection module 120 that may be embodied as instructions stored on computer-readable media (such as storage media 112) that, when executed on the processor 111, cause the IED to perform monitoring and protection operations. The protection operations may include, for example, overcurrent, directional, distance, underfrequency, and other protection operations using signals provided by the signal processing 130.

The signal processing 130 may include filtering, delays, and the like to filter out distortions and transients with frequencies different than the fundamental frequency of the power system. The signal processing 130 may process electrical power system signals in accordance with the several embodiments herein for use by the monitoring and protection operations of the IED 110. The signal processing 130 may be implemented in hardware, software (firmware), or a combination. For example, the signal processing 130 may include analog-to-digital (A/D) converters to sample the analog stimulus 122 and provide digitized analogs. The signal processing 130 may include circuitry and/or computer instructions for execution by the processor 111 to filter the digitized analogs and provide filtered samples for monitoring and protection operations in accordance with the various embodiments described herein.

The IED 110 may be communicatively coupled to the power system 100 through current transformers and voltage transformers, i.e. it may receive stimulus 122 from the power system 100. The stimulus 122 may be received directly via the measurement devices described above and/or indirectly via the communication interface 113 (e.g., from another IED or other monitoring device (not shown) in the electrical power system 100). The stimulus 122 may include, but is not limited to: current measurements, voltage measurements, and the like.

Furthermore, the IED 110 may include a monitored equipment interface 132 in electrical communication with a piece of monitored equipment. As illustrated, the monitored equipment interface 132 is in communication with a circuit breaker 102. The monitored equipment interface 132 may include hardware for providing a signal to the circuit breaker 102 to open and/or close in response to a command from the IED 110. For example, upon detection of a fault, the IED 110 may signal the monitored equipment interface 132 to provide an open signal to the appropriate circuit breaker 102, thus effecting a protective action on the electric power delivery system. In certain embodiments, the protective action may be effected by additional or separate devices. For example, upon determination of the fault, the IED 110 may signal other devices (using, for example, the network 160, or signaling another device directly) regarding the fault, which other devices may signal a breaker to open, this effecting the protective action on the electric power delivery system.

The signal processing in accordance with several embodiments described herein provides an output signal that maintains integrity and speed even during transient conditions. Generally, the signal processing 130 provides a band-pass filter to filter out distortions and transients with frequencies different than the fundamental frequency of the source signal.

Typically, such filters use a full-cycle window. Meaning the filter's window length equals the period of the fundamental frequency component, typically $\frac{1}{50}$ Hz or $\frac{1}{60}$ Hz (20 ms or 16.67 ms, respectively). To keep accuracy as the system frequency changes, these implementations measure frequency and apply adequate correction: either explicit, or by adjusting the sampling rate in such a way that the filtering system maintains the same nominal number of samples per cycle, even as the cycle slightly changes with the system frequency.

Using full-cycle windows slows down operation of a relay as compared with using raw inputs prior to any filtering. It takes one full cycle for the output of the filter to "forget" the pre-fault state and fully "charge" with the fault state. The output fully represents the new fault state only after one cycle into the fault. To mitigate this, half-cycle or even shorter windows are sometimes used in protective relays. Finite impulse response ("FIR") filters with shorter windows introduce less delay, but provide less accurate output during transients. As a result, the downstream protection logic needs to apply larger margins and/or delays. Larger margins and intentional delays in turn erase the speed benefits of shorter windows.

Typically, microprocessor-based relays operate on phasors. A phasor represents a sinewave signal with its magnitude and angle relative to some arbitrary angle reference, or with the real and imaginary parts relative to some arbitrary frame of reference. A pair of FIR filters can be used to obtain the phasor's real and imaginary parts. These filters are often referred to as orthogonal filters. For example, a sine and cosine filter can be used as a pair of orthogonal filters (the Fourier method), or a cosine and a cosine delayed by 0.25 of a cycle can be used (the cosine method).

The embodiments described herein may be used to obtain phasors for downstream usage in one or more protection principles as well as for pre-filtering the signal in general. For example, instead of using phasors to obtain a distance element, protection operations may use the coincidence timing method to obtain a distance element. Embodiments described herein show a method that changes the filter window size upon detection of a disturbance such that pre-disturbance signal values are not present in the filter, and grows the window size after disturbance until the window reaches its nominal length. This way the method "forgets" the pre-disturbance state very quickly resulting in fast operation (small delay). When the window length grows the method uses all new information to gradually provide maximum accuracy without an excessive delay just after the disturbance. Also, certain embodiments described herein reduce the numerical complexity of implementation. Additionally, embodiments allow application without frequency tracking, i.e. taking samples of the input signal at a constant (not variable) sampling rate.

Figure 2:
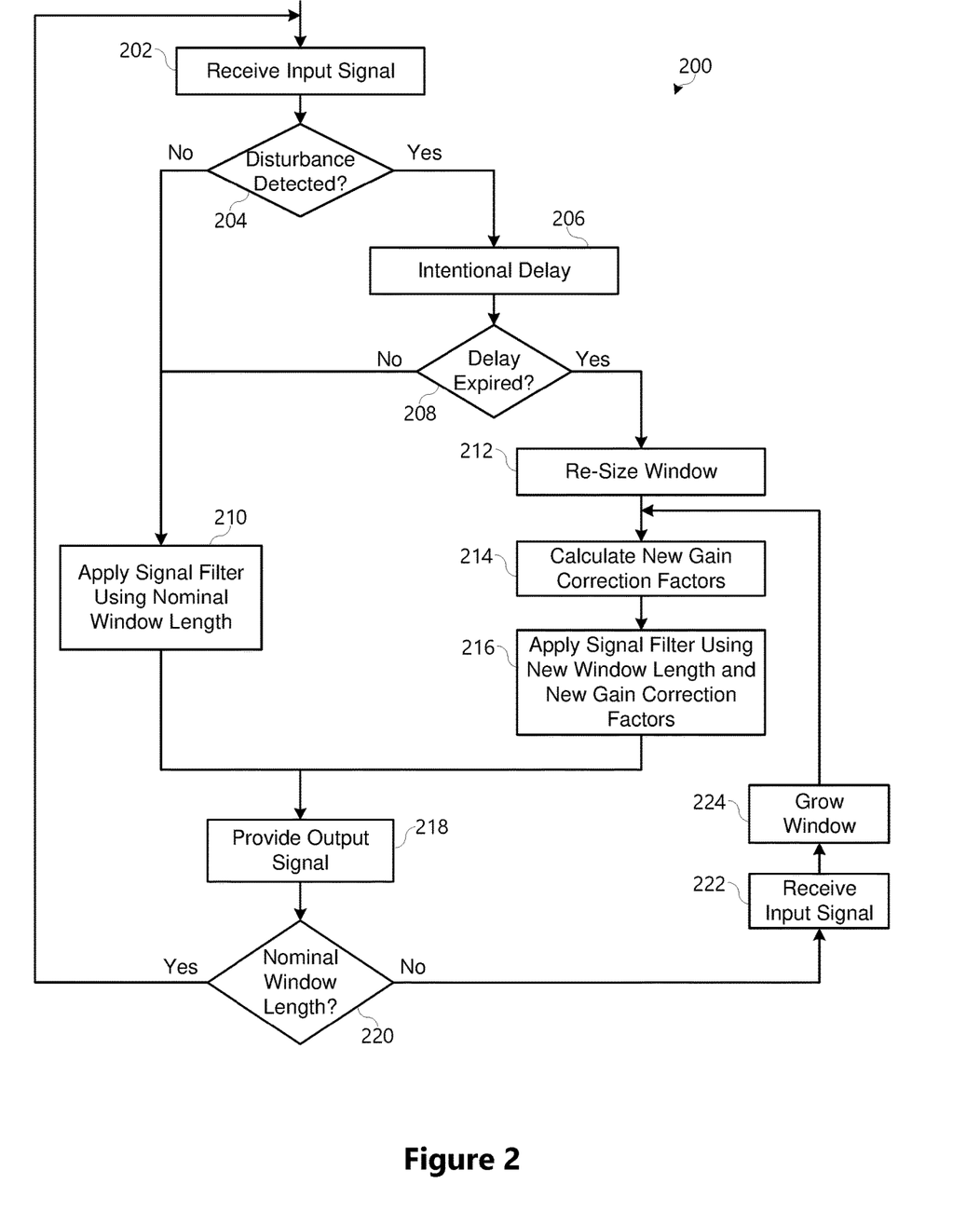
FIG. 2 illustrates a flow chart of a method for implementing a signal filter in accordance with several embodiments.

FIG. 2 generally illustrates a method 200 for implementing a filter after a disturbance with window re-sizing and growing. The method 200 continuously receives an input signal 202 such as a voltage or current signal from instrument transformers such as PTs, CTs, or the like. It should be noted that the input signals may be received from an intermediate device configured for signal processing such as a merging unit or the like. If a disturbance is not detected 204 (e.g. under nominal conditions), the method applies the signal filter using nominal filter window length 210, and provides the filtered signal output 218 for use by consuming algorithms. That is, the filter may use the predetermined window length and intentional delays in protection algorithms associated with the filter type. For example, a Fourier filter may be used with a full-cycle window length. The resulting signal may be provided for processing by protection and monitoring functions of the relay, and may include further signal processing. The method continues to receive the incoming signal 202, filter 210, and provide an output signal 218 while a disturbance is not detected.

Upon detection of a disturbance 204, the method intentionally delays resizing by using a timing operation 206. The filter window may be re-sized 212 to a shorter window. With the delay, no pre-disturbance signals are included in the short window following the disturbance. This brings the benefit of both faster operation and greater accuracy compared with having the same short window continuously slide and include at some time both the pre-disturbance and disturbance signal values. It is convenient to keep the filter data window coefficients the same regardless of the window length. If so, adequate gain correction factors are required, which depend on the present window length. Gain correction factors may be calculated 214 not only for the new window length but also for the signal frequency. The signal filter with the new window length and new gain correction factors may be applied to the signal 216. The resulting signal may be provided 218 to the consuming protection and monitoring operations. If the window length has reached the nominal window length 220, then the method returns to receiving the input signal 202, and proceeds as above. Otherwise at 220, the method continues by receiving the input signal 222 and growing the window 224 by increasing the window length at a predetermined rate. The method may return to calculating a new gain correction 214, and so on.

With the intentional delay 206 and the growing of the window 224, the filter will not include pre-disturbance data, and will increase in accuracy as the window grows to its nominal length. The window length may increase at the same rate as the signal processing rate such that the lagging edge of the filter timeframe remains static (or at least does not reach backward into pre-disturbance samples) while the leading edge of the filter timeframe increases (this corresponds to the rate of movement for the window mid-point of half the processing rate). In other embodiments, the window length may increase at a rate slower than the signal processing rate. The shortened window increases the speed of providing a signal following a disturbance, while growing the window increases accuracy as the window grows.

Figure 3:
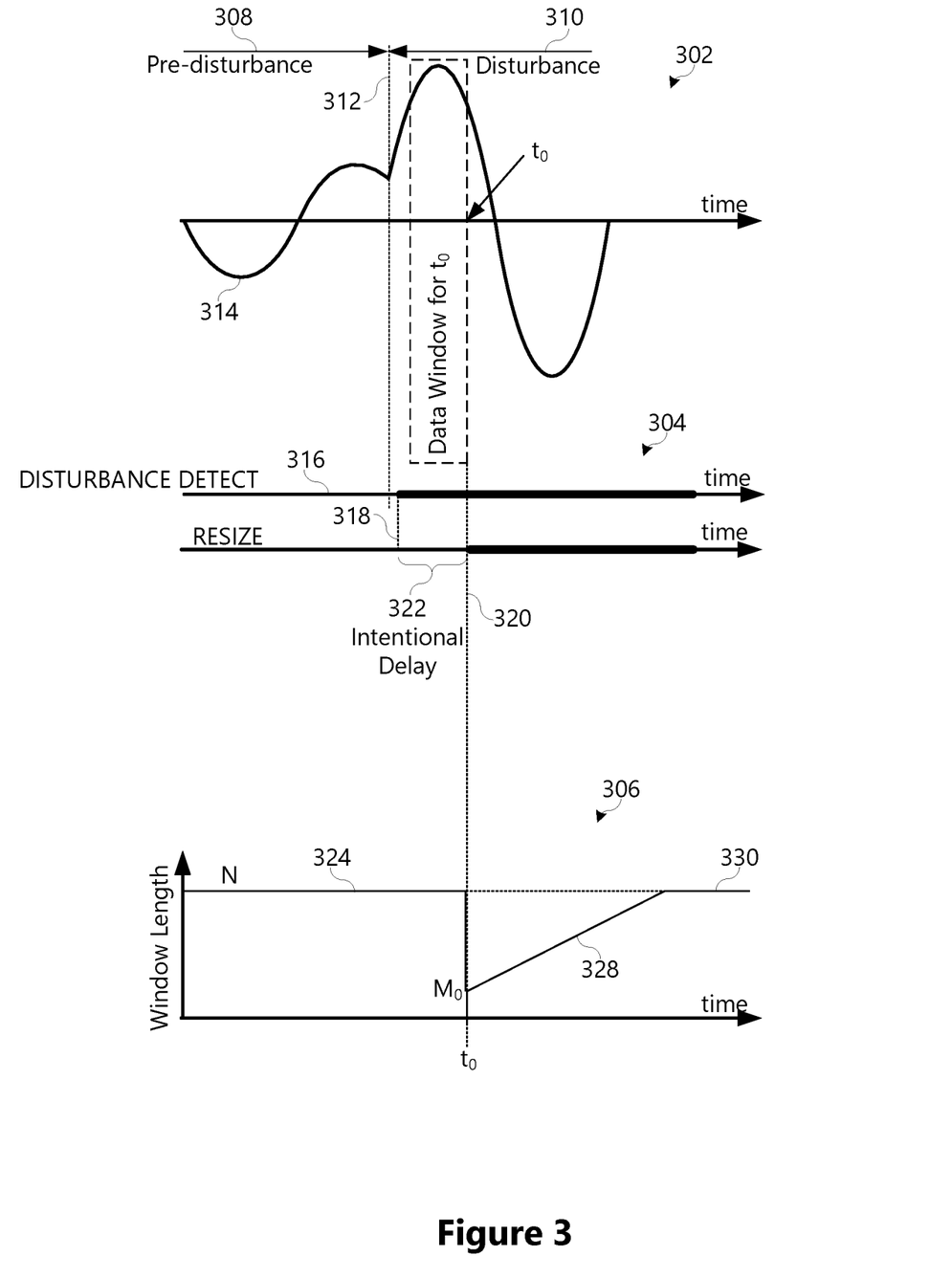
FIG. 3 illustrates a timing diagram for window resizing of a signal filter.

FIG. 3 illustrates plots over time of an input signal to be sampled and filtered 302, disturbance detection and window resizing bit assertion 304, and window length 306. The input signal 314 spans pre-disturbance 308 and post-disturbance 310. A short time after occurrence of the disturbance 312, a disturbance detector 316 asserts (DISTURBANCE DETECT bit) 318. A practical disturbance detector responds very quickly to the changes in the input signal on the order of 1 ms or faster, especially if it works based on traveling waves or incremental quantities. After an intentional delay 322, the resize bit picks up (RESIZE), and the window resize logic described herein is triggered. If a short data window were to be applied immediately, such a short data window, in the order of 3 ms, would include both the pre-disturbance samples and the disturbance samples. Because of this mix of two power system states (pre-disturbance and disturbance), this short data window would cause large filtering errors. This problem is solved by delaying the resizing until the re-sized (short) data window only includes the disturbance state. For example, the illustrated 3 ms data window can be applied starting after an intentional delay of 4 ms into the disturbance state. The RESIZE bit signifies the operation of resizing, i.e. switching to a short data window and following up with growing the length of the window with the passing of time. The window length at the nominal value N 324 prior to the disturbance, dropping instantly to the minimum value $M_0$ at the rising edge of the RESIZE bit 322, and growing back 328 to the full-size N 330. The delayed resizing ensures that the short window is filled with only samples corresponding to the new power system state and improves the accuracy of the signal used in later monitoring and protection of the electric power system.

The input signal 314 may be treated with a pre-filter. For example, current signals may be treated with a mimic filter designed to remove the decaying DC component. Such a pre-filter would introduce a group delay, meaning the pre-disturbance state would be slightly extended into the disturbance state ("smudged" forward). If so, the intentional delay 322 between the DISTURBANCE DETECT bit assertion at 318 and the RESIZE bit assertion 320 in FIG. 3 must be increased to allow the pre-disturbance state to be flushed out of the filtering system. Accordingly, another 1-2 ms of intentional delay may be applied when asserting the RESIZE bit 322.

Figure 4:
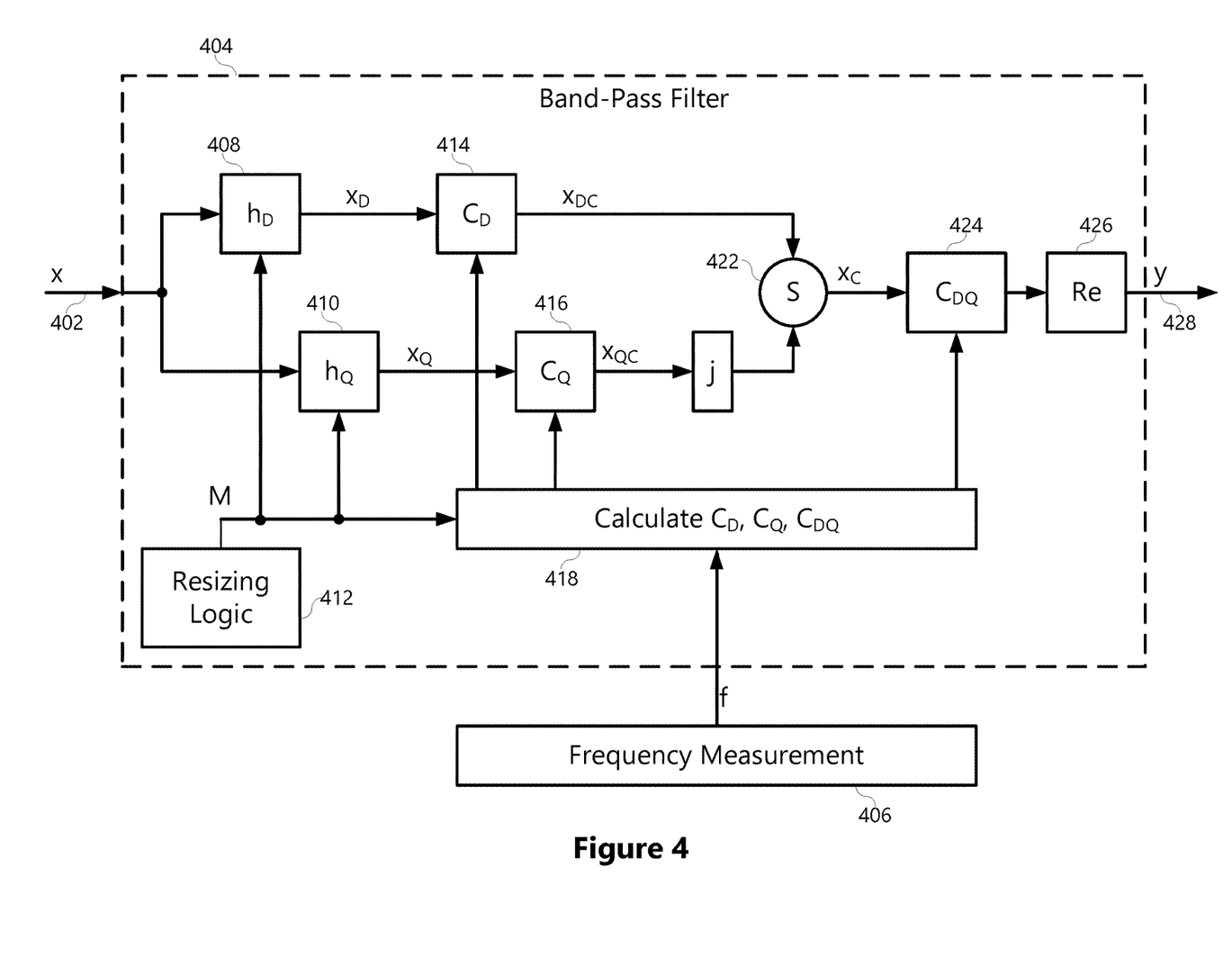
FIG. 4 illustrates a functional block diagram for a signal filter in accordance with embodiments described herein.

FIG. 4 illustrates a simplified block diagram of a band-pass variable-window filter 404 according to several embodiments herein. Samples of the input signal x 402, are filtered and provided as samples in the output signal y 428. The filter 404 can be implemented at a fixed sampling rate $f_S$ assuming the sampling rate is relatively high compared with the fundamental frequency component expected in the input signal x 402. For example, $f_S$ can be in the order of 2-10 kHz. The signal frequency f of an electric power system may be on the order of 50 Hz or 60 Hz with up to just a few Hz of deviation from those nominal frequency values.

The filter uses a window resizing logic subsystem 412 using window resizing methods as described above. That is, upon detection of a disturbance, the effective window length is resized (reduced) by the resizing logic 412 to a minimum value $M_0$. The resize logic 412 may then grow the window length until it again reaches the nominal window size. For example, if implemented using $f_S$=5 kHz for a signal frequency f of 50 Hz, the filter may have 5,000/50=100 samples in a nominal power system cycle. The resizing logic 412 may apply a short data window such as $1/10^{th}$ or $1/8^{th}$ of a power system cycle when it detects a disturbance (10-12 sample in this example). After resizing, the window length is increased to take advantage of new samples x as they become available. For example, the window can be resized to 10 samples, and increase with passing of time as per this series: 10, 10, 12, 12, 14, 14, 16, 16, 18, 18, . . . 98, 98, 100, 100. Once the window length reaches the size that is considered adequate given the steady state error and filtering requirements (such as the nominal window length), the window stops growing and starts sliding again. Therefore, an example set of window lengths is:

100, 100, 100, 10, 10, 12, 12, 14, 14, . . . 96, 96, 98, 98, 100, 100, 100, 100, . . . .

The window resizing may use various criteria to resize a window or refrain from resizing. Typically, a disturbance detector is used to trigger resizing of the window. A disturbance detector can monitor changes in power system currents, voltages, combinations, or the like. In one embodiment, the resizing logic may require that the power delivery system was operating normally (e.g. currents, voltages, and/or frequency within nominal operating parameters) before the disturbance before allowing window resizing. Once resizing takes place, no further (repeated) resizing may be allowed for a predetermined period such as a predetermined time, number of samples, power system cycles, or the like. That is, a subsequent disturbance for the predetermined period will not result in resizing the window downward. If selected protection elements assert (e.g. overcurrent protection, distance protection, differential protection, directional protection and the like) following resizing, further resizing may be inhibited. Depending on the protected apparatus, the resizing logic may follow different principles and logic. For example, a distance element application may require that the terminal line voltages are normal, there is no unbalance in the line currents and no open pole condition is present, before allowing resizing. Further, the version suitable for the distance element application may initiate resizing on changes in currents. In another example, a differential element application may require the differential current to be low (e.g. below a predetermined threshold) before allowing resizing. Further, the version suitable for differential applications may initiate resizing from the disturbance in the differential or restraining currents. The window is resized such that it does not include any pre-disturbance (pre-fault) data. The window may grow to only include new samples, and not any pre-disturbance (pre-fault) data.

In certain embodiments, the filter 404 may not require frequency tracking, i.e. it does not require constantly adjusting the sampling rate to maintain a fixed and known number of samples per cycle even as the cycle changes in the power system. However, the disclosed embodiments may be used with such frequency-tracking applications. The input signal x 402 may be filtered using two orthogonal filters, for example the FIR filters with data windows (coefficients) denoted as $h_D$ 408 and $h_Q$ 410, to provide filtered signals $x_D$ and $x_Q$ (where D stands for a direct component and Q stands for a quadrature component of the signal). In one implementation, the two data windows are pre-calculated using the following Equations 1a and 1b:

$$h_{D(k)} = \cos\left(\frac{2\pi \cdot (k - 0.5)}{N}\right), k = 1 \ldots \frac{N}{2}$$ Eq. 1a $$h_{Q(k)} = \sin\left(\frac{2\pi \cdot (k - 0.5)}{N}\right), k = 1 \ldots \frac{N}{2}$$ Eq. 1b Where N is the nominal (full size) window length, and is pre-calculated as illustrated in Equation 2:

$$N = 2 \cdot \left(\text{round}\left(\frac{0.5 \cdot f_S}{f_{NOM}}\right) + 1\right)$$ Eq. 2 where:
$f_S$ is the sampling frequency;
$f_{NOM}$ is the nominal power system frequency; and,
"round" refers to rounding to the nearest integer.

Equation 3 intentionally makes the full-size window length N an even number. As a result, the window coefficients per Equations 1 and 2 are symmetrical (the D filter) and anti-symmetrical (the Q filter) with respect to the mid-point of the data window. This in turn allows simplification of the filtering calculations. Specifically, the outputs from the two filters $x_D$ and $x_Q$ may be calculated using half the number of multiplications as follows in Equations 3a and 3b:

$$x_{D(n)} = \sum_{k=1}^{k=M/2} h_{D(k)} \cdot (x_{(n-M/2-k+1)} + x_{(n-M/2+k)})$$ Eq. 3a $$x_{Q(n)} = \sum_{k=1}^{k=M/2} h_{Q(k)} \cdot (x_{(n-M/2-k+1)} - x_{(n-M/2+k)})$$ Eq. 3b where:
M refers to the present data window length.
It should be noted that Equations 3a and 3b optimize the data window coefficient storage (half of the coefficients are needed) and replace half of the multiplications with additions or subtractions.

The filtering operation illustrated in Equations 3a and 3b uses the present data window length M, which is not fixed but variable. The value of M is controlled by the resizing method generally illustrated in FIGS. 2 and 3, and is generally a number between the full-size N and the minimum size $M_0$. When resizing takes place, M changes instantly from N to $M_0$, and grows at a freely selected rate with the passing of time. In various embodiments, M may not grow faster than by 1 sample with each new sample of the input x so that the window does not "grow" toward the left edge into pre-disturbance samples. Eventually the window M assumes the full-size value N.

The gain of filters (such as in Equations 3a and 3b) that use coefficients (such as in Equations 1a and 1b) depend on two factors: the present signal frequency f; and the present window length M. Methods herein require compensating for variability in the gain by multiplying the $x_D$ and $x_Q$ signals by gain correction factors $C_D$ and $C_Q$. In accordance with one embodiment, to obtain the gain correction factors $C_D$ and $C_Q$, the discrete frequency response of the filters may be calculated for any given combination of f and M.

An improvement to calculation of the correction factors in real time or calculating correction factors for any given combination of f and M, is to calculate approximate gain correction factors as follows. If the sampling rate is sufficiently high compared with the nominal signal frequency ($f_S/f_{NOM} \gg 10$) the digital FIR filters may be treated as analog filters, i.e. as digital filters working at an infinite sampling rate. Under this assumption, the output of the filter may be calculated for the input signal of unity magnitude and arbitrary frequency f using continuous-domain integrals as follows in Equations 4a and 4b:

$$X_D = \int_{-\frac{M}{N}\pi}^{+\frac{M}{N}\pi} \cos(z) \cdot \cos\left(\frac{f}{f_{NOM}} \cdot z\right) dz$$ Eq. 4a $$X_Q = \int_{-\frac{M}{N}\pi}^{+\frac{M}{N}\pi} \sin(z) \cdot \sin\left(\frac{f}{f_{NOM}} \cdot z\right) dz$$ Eq. 4b In should be appreciated that this disclosure is not limited to the sine/cosine filter shapes in the preceding equations. Any pair of orthogonal filters can be used, such as Walsh filters for example. Equations 4a and 4b may be used to obtain reasonable approximations of the gain correcting factors. In general, Equations 4a and 4b can be written as follows in Equations 4c and 4d for any orthogonal pair of functions generally $F_D(z)$ and $F_Q(z)$:

$$X_D = \int_{-\frac{M}{N}\pi}^{+\frac{M}{N}\pi} F_D(z) \cdot \cos\left(\frac{f}{f_{NOM}} \cdot z\right) dz \qquad \text{Eq. 4c}$$

$$X_Q = \int_{-\frac{M}{N}\pi}^{+\frac{M}{N}\pi} F_Q(z) \cdot \sin\left(\frac{f}{f_{NOM}} \cdot z\right) dz \qquad \text{Eq. 4d}$$

Equations 4a-d take advantage of the fact that the filter gain is independent from the phase between the window function ($F_Q(z)$) and the input signal ($\sin(z \cdot f/f_{NOM})$). Therefore, Equations 4a-d assume the most convenient form by aligning the two functions at z=0, i.e. the mid-point of the window.

The continuous-time integrals of Equations 4a and 4b have a solution. The sought gain multipliers are the reciprocals of the values obtained by Equations 4a and 4b ($C_D=1/X_D$ and $C_Q=1/X_Q$). Accordingly, the approximated gain correction factors $C_D$ and $C_Q$ may be calculated 418 as follows in Equations 5a, 5b, 6a, and 6b for the functions $F_D$ and $F_Q$ of Equations 4a and 4b:

$$C_D = \left(\frac{M}{2} \cdot \left(\frac{\sin(A)}{A} + \frac{\sin(B)}{B}\right)\right)^{-1} \qquad \text{Eq. 5a}$$

$$C_Q = \left(\frac{M}{2} \cdot \left(\frac{\sin(A)}{A} - \frac{\sin(B)}{B}\right)\right)^{-1} \qquad \text{Eq. 5b}$$

where:

$$A = \pi \cdot \frac{M}{N} \cdot \left(\frac{f}{f_{NOM}} - 1\right) \qquad \text{Eq. 6a}$$

$$B = \pi \cdot \frac{M}{N} \cdot \left(\frac{f}{f_{NOM}} + 1\right) \qquad \text{Eq. 6b}$$

That is, to correct for the gain of the filters (Equations 3a and 3b) that changes with the window length M and signal frequency f, one improvement uses the simple Equations 6a and 6b to calculate the $C_D$ and $C_Q$ gain correction factors, and performs the correction by multiplying the filter outputs $x_D$ and $x_Q$ by correction multipliers $C_D$ 414 and $C_Q$ 416 to provide corrected outputs $x_{DC}$ and $x_{QC}$, respectively. Equations 5a, 5b, 6a, and 6b are considerably simpler than the accurate equations derived from the discrete transfer function of the filters using the standard approach. They are approximations, but are accurate enough for practical implementations, especially if the sampling rate is sufficiently high with respect to the signal frequency. This improvement avoids the less efficient method of calculating correction factors for each combination of f and M or calculating the correction factors in real time.

The correction multipliers are functions of signal frequency f which may be provided by the frequency measurement subsystem 406. Any of the several available solutions for obtaining a system frequency may be use by the frequency measurement subsystem 406. For example, zero-crossing times, peak times, or the like may be used to calculate signal frequency.

Although it has been compensated for the window length and frequency, the corrected signal $x_{DC}$ may also have a group delay with respect to the input signal x. This group delay may not be relevant in some applications. If so, the $x_{DC}$ signal may be used as the output of the filter and no other calculations are required. In various embodiments, however, the filtered signal may be compensated for the group delay with respect to the input x. In one embodiment compensation for the group delay may use a correction factor $C_{DQ}$. A Q-filter may be used to create an instantaneous complex signal ("instantaneous phasor") $x_C$ by calculating a sum 422 in accordance with Equation 7:

$$x_C = x_{DC} + j \cdot x_{QC} \qquad \text{Eq. 7}$$

The instantaneous phasor $x_C$ may exhibit a shift with respect to the input signal by half the window length M (which is not fixed but variable). If so, the phasor may be compensated for the phase shifting by multiplying 424 by the complex correction factor $C_{DQ}$ illustrated in Equation 8 and calculated in block 418:

$$C_{DQ} = 1\angle\left(\frac{\pi \cdot (M - 0.5)}{N} \cdot \frac{f}{f_{NOM}}\right) \qquad \text{Eq. 8}$$

The factor 0.5 in Equation 8 is valid for implementations that increase the window size M by 1 sample each new sample. The correction factor $C_{DQ}$, for implementations that grow the window size slower than that, may be calculated by modification of the 0.5 factor. After multiplying 424 the complex signal $x_C$ by the complex correction factor $C_{DQ}$, the the real part of the product may be calculated 426 and presented as the filter output y. The output y may be used in the various protection and monitoring functions of the electric power delivery system such as, for example, distance elements, directional elements, and the like.

Figure 5A:
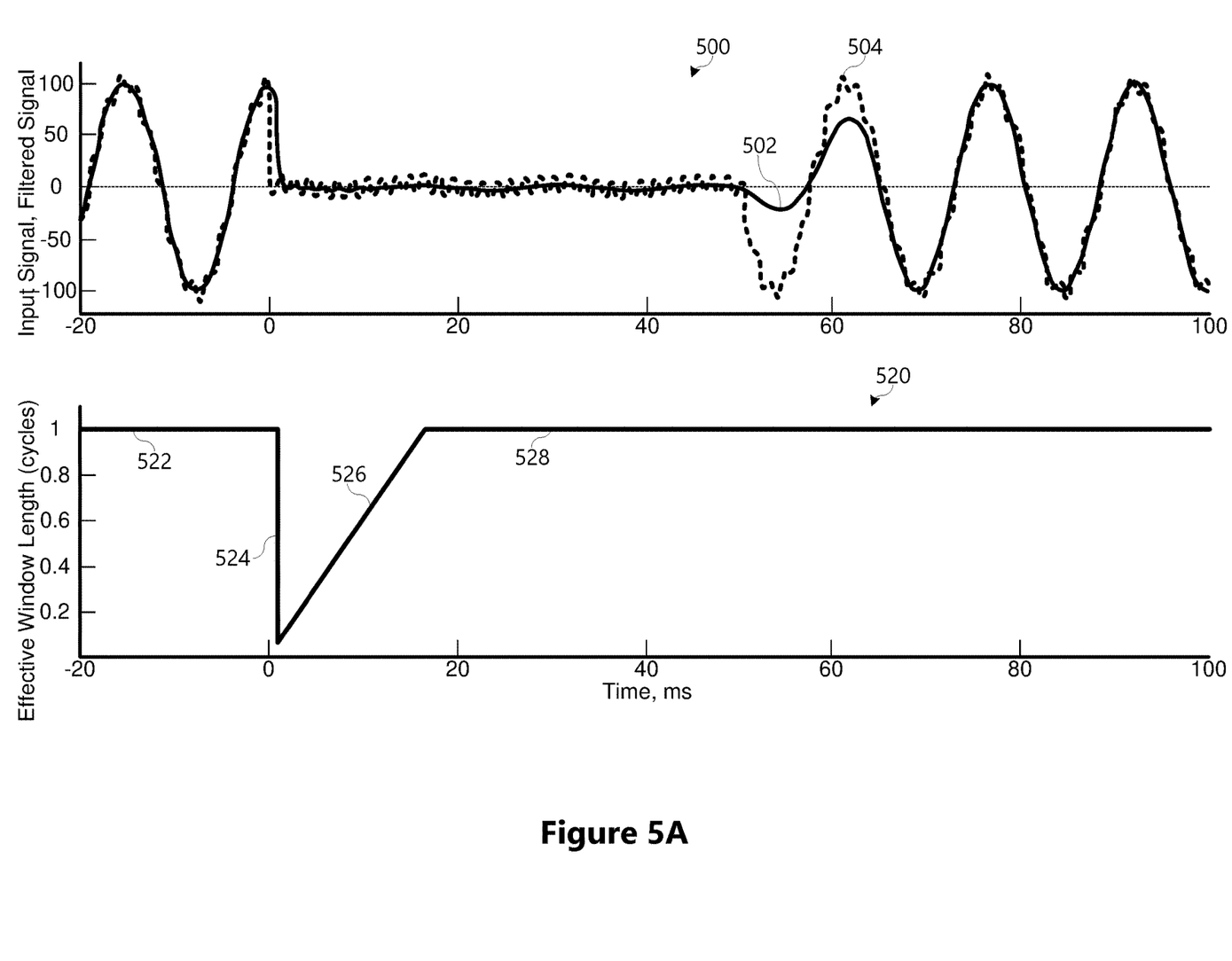
FIGS. 5A and 5B illustrate plots of input signals, output signals, and effective window length of one example of an embodiment described herein.
Figure 5B:
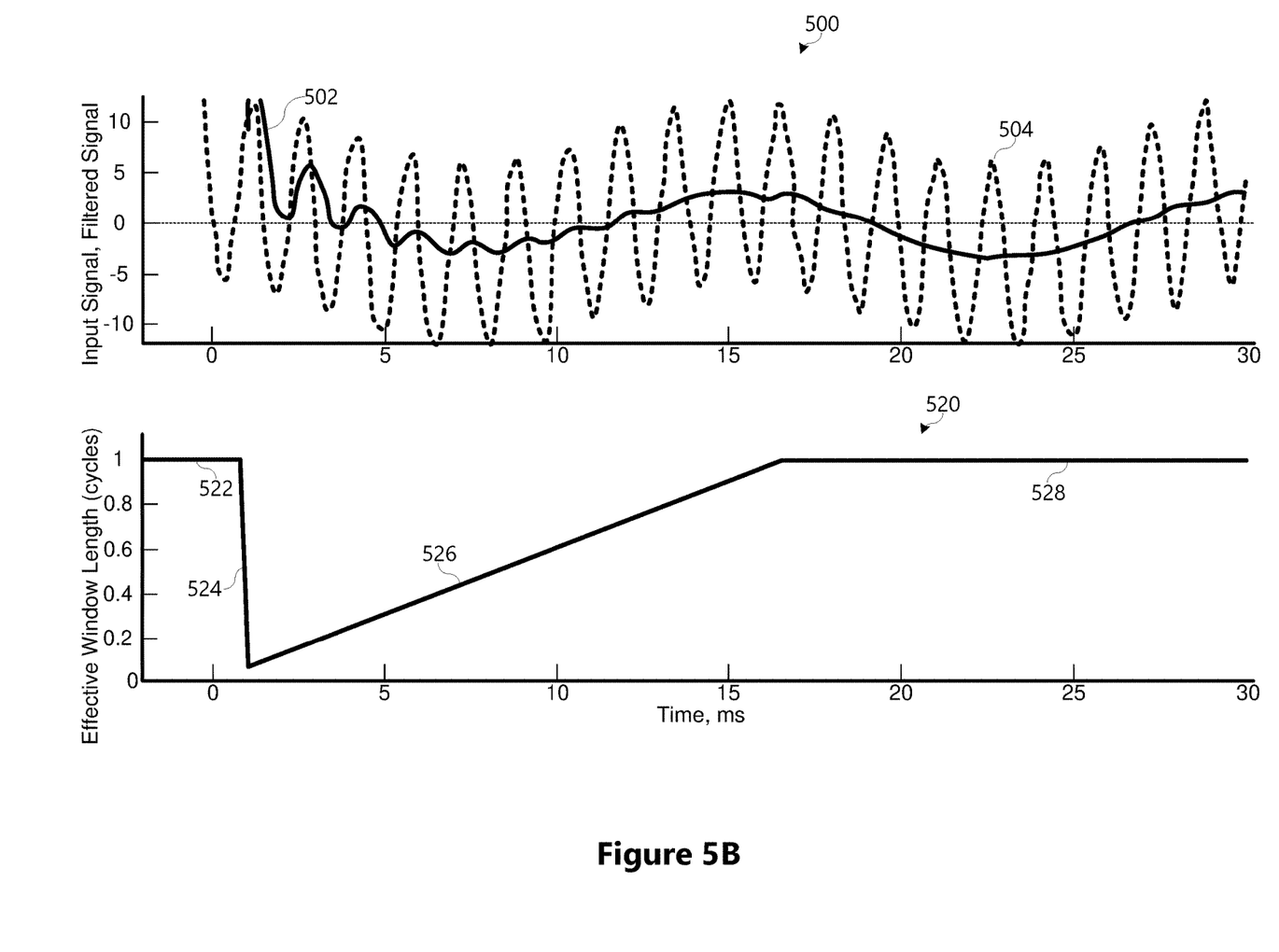

FIGS. 5A and 5B illustrate an example of an output of the embodiments described herein, as a plot 500 of input signals 504 and output signals 502, and a plot 520 of effective window length over time. FIG. 5B illustrates a portion of the signals of FIG. 5A to better illustrate the details of the input 504 and output 502 signals. The input signal is a voltage signal from an electric power delivery system. However, the input signal may include any nominally periodic signal for filtering and use in selected protection and monitoring elements. As can be seen, the input signal 504 and output signal before time t=0 are in pre-disturbance condition, where the output signal 502 closely follows the input signal, using a full-length window length 522. Upon occurrence of a disturbance (such as a fault on a power system) at time t=0, and after the intentional delay, the window length is reduced 524 from 1 cycle to around 0.1 cycle, and gradually increases over time 526 until it reaches the nominal length 528 of 1 cycle. The variable-window filter cleans the input signal very effectively passing only the fundamental frequency component to the output. This effective filtering is especially visible in the steady state before and after the disturbance illustrated in FIG. 5B. Initially, at time t=0 and about t=5 ms the output still contains some distortions because the filter prioritizes speed over accuracy. However, as the window length grows the filtering becomes increasingly more effective and the distortions at the output become suppressed. At time of around t=15 ms and onwards, the output is very clean. When the disturbance is removed at about t=50 ms, the window is not resized and the filter responds "slowly" as intended. The effect of using a variable data window is best appreciated by comparing the speed of measurement at the beginning of the disturbance (t=0 ms) when resizing takes place, and at the end of the disturbance (t=50 ms) when the resizing is intentionally inhibited.

While specific embodiments and applications of the disclosure have been illustrated and described, it is to be understood that the disclosure is not limited to the precise configurations and components disclosed herein. Moreover, principles described herein may also be utilized for distance protection and overcurrent protection. Accordingly, many changes may be made to the details of the above-described embodiments without departing from the underlying principles of this disclosure. The scope of the present invention should, therefore, be determined only by the following claims.

What is claimed is:

1. A system to provide protection for an electric power system, comprising:
    an instrument transformer to obtain power system signals from the electric power system;
    a stimulus interface to receive power system signals from the instrument transformer;
    a signal processor in communication with the stimulus interface, to:
        sample the power system signals at a sampling frequency to produce digitized power system signals;
        filter the digitized power system signals using a signal filter with a nominal data window length to provide filtered power system signals;
        upon detection of a power system disturbance:
            initiate a predetermined resize delay;
            upon expiration of the predetermined resize delay, decrease a data window length to a second data window length, and for subsequent signal processing cycles until the data window length reaches the nominal data window length:
                filter the digitized power system signals using the signal filter with the second data window length and provide the filtered power system signals; and
                increase a length of the second data window length;
    a protection element in communication with the signal processor, to determine a condition of the electric power system using the filtered power system signals.

2. The system of claim 1, wherein the signal processor is further configured to calculate a gain correction factor for the signal filter.

3. The system of claim 2, wherein the signal processor is configured to apply the gain correction factor to provide the filtered power system signals.

4. The system of claim 3, wherein the signal processor is configured to calculate the gain correction factor using the second data window length.

5. The system of claim 4, wherein the gain correction factors comprise approximations developed using continuous-domain integrals to approximate discrete-domain frequency response.

6. The system of claim 5, wherein the signal filter comprises a pair of orthogonal filters.

7. The system of claim 6, wherein the approximations comprise $C_D$ and $C_Q$ calculated using:

$$C_D = 1/X_D$$

$$C_Q = 1/X_Q$$

$$X_D = \int_{-\frac{M}{N}\pi}^{+\frac{M}{N}\pi} f_D(z) \cdot \cos\left(\frac{f}{f_{NOM}} \cdot z\right) dz$$

$$X_Q = \int_{-\frac{M}{N}\pi}^{+\frac{M}{N}\pi} f_Q(z) \cdot \sin\left(\frac{f}{f_{NOM}} \cdot z\right) dz$$

where:
   $f_D$ and $f_Q$ comprise base functions for the pair of orthogonal filters;
   M comprises the second data window length;
   N comprises the nominal data window length;
   f comprises a frequency of the power system signal; and,
   $f_{NOM}$ comprises a nominal power system frequency.

8. The system of claim 1, wherein the predetermined resize delay accounts for a group delay of a pre-filter and a frequency response of the instrument transformer.

9. The system of claim 1, wherein the signal processor is further configured to decrease the data window length only upon detection of the power system disturbance preceded by nominal power system operation.

10. The system of claim 9, wherein nominal power system operation comprises power system voltage, current, and frequency within nominal operating parameters.

11. The system of claim 1, wherein the signal processor is further configured to decrease the data window length only upon detection of the power system disturbance after a predetermined period following a previous data window length decrease.

12. The system of claim 1, wherein the signal processor is further configured to decrease the data window length only upon detection of the power system disturbance after a predetermined period following assertion of a power system protection element.

13. The system of claim 12, wherein the power system protection element comprises one selected from the group consisting of: a distance protection element, and overcurrent protection element, an overvoltage protection element, an undervoltage protection element, and a differential protection element.

14. The system of claim 1, wherein the predetermined resize delay is determined such that the digitized power system signals before the power system disturbance are not included in the second data window.

15. The system of claim 1, wherein the signal processor is configured to increase the length of the second data window at a predetermined rate.

16. A method to provide protection for an electric power system using a variable window length filter, comprising:
    sampling the electric power system at a sampling frequency to produce digitized power system signals;
    filtering the digitized power system signals using a signal filter with a nominal data window length to provide filtered power system signals;
    upon detection of a power system disturbance:
        initiating a predetermined resize delay;
        upon expiration of the predetermined resize delay, decreasing a data window length to a second data window length, and for subsequent signal processing cycles until the data window length reaches the nominal data window length:

filtering the digitized power system signals using the signal filter with the second data window length and provide the filtered power system signals; and, increasing a length of the second data window length; and, determining a condition of the electric power system using the filtered power system signals.

17. The method of claim 16, wherein the predetermined resize delay is determined such that the digitized power system signals before the power system disturbance are not included in the second data window.

18. The method of claim 16, further comprising calculating a gain correction factor for the data window length and applying the gain correction factor to provide the filtered power system signals.

19. The method of claim 18, wherein the gain correction factor comprises an approximation of a discrete-domain frequency response, developed using continuous-domain integrals.

20. The method of claim 16, wherein the signal filter comprises a pair of orthogonal filters and the gain correction factor comprises a pair of gain correction factor approximations for the second data window length.

* * * * *